United States Patent [19]

Sylvan

[11] 3,906,298

[45] Sept. 16, 1975

[54] PROTECTIVE APPARATUS FOR DIGITAL LOGIC CIRCUITS

[75] Inventor: Tage Peter Sylvan, Milton, Mass.

[73] Assignee: Teradyne, Inc., Boston, Mass.

[22] Filed: Jan. 28, 1974

[21] Appl. No.: 437,337

[52] U.S. Cl. .................. 317/33 SC; 317/31; 317/50; 307/202

[51] Int. Cl.² ........................ H02H 3/20; H02H 7/09

[58] Field of Search ........... 317/33 R, 33 JR, 33 SC, 317/49, 50; 307/202, 252 R, 252 C, 252 T, 252 UA, 252 W, 235 R; 340/248 A, 248 B, 248 C; 324/73 R, 72.5

[56] References Cited

UNITED STATES PATENTS

| | | | |
|---|---|---|---|
| 3,614,474 | 10/1971 | Hahn | 307/252 R |
| 3,728,557 | 4/1973 | Pelly et al. | 307/252 UA |
| 3,787,735 | 1/1974 | De Witte et al. | 307/235 R |
| 3,789,242 | 1/1974 | Cantor | 307/235 R |

*Primary Examiner*—J. D. Miller
*Assistant Examiner*—Patrick R. Salce
*Attorney, Agent, or Firm*—Kenway & Jenney

[57] ABSTRACT

In the protective apparatus disclosed herein, digital logic circuits coupled to external interface terminals are protected from externally applied over-voltages by coupling the digital logic signals through inexpensive SCRs (Silicon Controlled Rectifiers) operated in a remote base configuration so that in such a way that current is limited and excess voltages appear across the SCR rather than being applied to the logic device.

10 Claims, 6 Drawing Figures

PROTECTIVE APPARATUS FOR DIGITAL LOGIC CIRCUITS

BACKGROUND OF THE INVENTION

This invention relates to protective apparatus for digital logic circuits and more particularly to such apparatus which will protect digital logic circuits from accidentally applied over-voltages when the digital logic circuit is coupled to externally accessible interface terminals.

In some environments and particularly in the field of industrial controllers, various systems or machines are used which must interface both with industrial power circuits, e.g., 110 and 220 volt a.c. power circuits, and also with digital logic signal levels, e.g., 5 volt d.c. digital logic signals in the case of commonly utilized TTL (transistor-transistor-logic) integrated circuits. If both types of circuit interfaces are brought out of the equipment enclosure in a common area or, even more critically, through a common terminal block, a high probability exists for the accidental application of voltages far exceeding the maximum input and/or output voltage ratings to the digital logic circuits. As the application of such over-voltages is highly likely to cause serious and almost instantaneous damage to digital logic circuits, a need exists for some means which will protect the digital logic circuits or devices, preferably without requiring resetting or the replacement of components after the accidental over-voltage is removed.

Among the several objects of the present invention may be noted the provision of apparatus for protecting digital logic devices against externally applied voltages substantially outside the normal range of permissible operating voltages for the device; the provision of such apparatus which will protect either input or output circuits and which will permit appropriate coupling of input and output signals to the device; the provision of such apparatus which does not require the replacement or resetting of components after an over-voltage condition is terminated; the provision of such apparatus which is of relatively simple and inexpensive construction; and the provision of such apparatus which is reliable and which will operate under a wide range of conditions. Other objects and features will be in part apparent and in part pointed out hereinafter.

SUMMARY OF THE INVENTION

Briefly, apparatus of the present invention is operative to protect a digital logic circuit against externally applied over-voltages which may be applied to an interface terminal to which the logic circuit is coupled. The apparatus employs an SCR, the anode of the SCR being connected to the interface terminal. A substantially constant current, i.e., a current supplied at relatively high source impedance, is applied to the cathode of the SCR. The gate of the SCR is connected to the digital logic circuit, logic level signals being transferred between the gate and the anode of the SCR, with current values being limited and with any excess voltage appearing essentially across the SCR, rather than being applied to the digital logic device.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
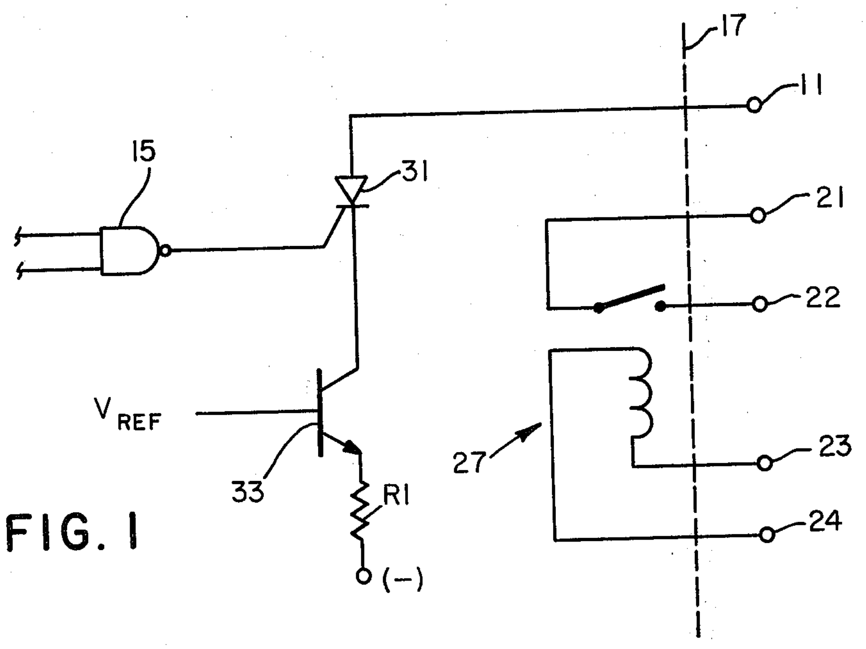
FIG. 1 is a schematic diagram illustrating a digital logic level output interfacing circuit employing protective apparatus in accordance with the present invention.

Referring now to FIG. 1, there is indicated at 11 an interface terminal through which digital logic level signals are to be coupled, the signals originating from a digital logic device such as a TTL NAND gate as indicated at 15. Terminal 11 is shown as being external with respect to a protective enclosure, indicated diagrammatically at 17. For the purpose of illustration, enclosure 17 may be considered to be the housing of an industrial controller. As is understood, such a controller may also involve other terminals 21–24 which are connected to power circuit components of the controller, e.g., a 110 v.a.c. relay as indicated at 27. Accordingly, there exists an appreciable danger that power circuit voltages may inadvertently be applied to the terminal 11.

Figures 2, 3:
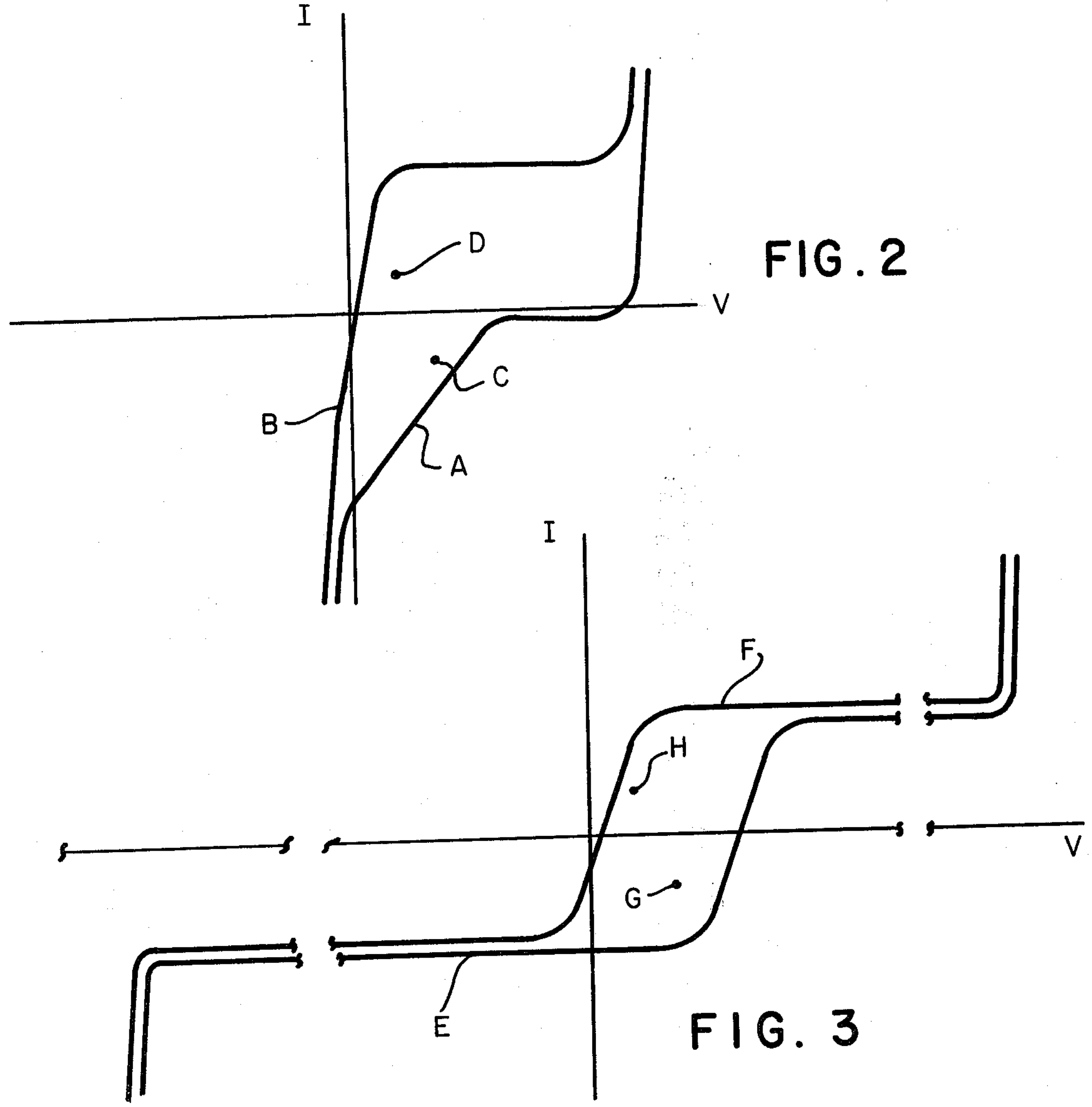
FIG. 2 is a graphical representation of the voltage current output characteristics of a digital logic device employed in the circuit of FIG. 1.
FIG. 3 is a graphical representation of the voltage current output characteristics of the circuit of FIG. 1.

FIG. 2 represents the voltage current output characteristic of the TTL logic gate 15, the curve A representing the output characteristic when the output signal from the digital logic circuit is high (a logical 1), while the curve B represents the output characteristic when the digital output is low (a logical 0). In this drawing, the threshold for establishing a logical 1 at the input of a similar TTL circuit is indicated at C, while the threshold for similarly establishing a logical 0 is indicated at D. As the curve A passes below and to the right of the point C and the curve B passes above and to the left of the point D, it can be seen that the output characteristic is tailored to be able to drive TTL input circuits. However, as may also be seen, the current which can be drawn by the application of voltages outside the normal operating range is not limited. In other words, once a threshold or knee in the characteristic is passed, the current drawn rises precipitously for further increases in applied voltage. Thus, the external application of voltages beyond these breakdown regions will lead to the destruction of the output circuit of the device 15.

To protect the digital logic circuit 15 against such accidental over-voltages, the output circuit of FIG. 1 couples the digital logic level signals between the digital logic circuit 15 and the terminal 11 through an SCR 31 which is operated in a remote base configuration. The anode of SCR 31 is connected directly to the interface output terminal 11 while the digital logic signal from device 15 is applied directly to the gate of the SCR 31. An NPN transistor 33 is operated as a constant current source to couple a current of an essentially predetermined magnitude to the cathode of SCR 31. The operation of transistor 33 as a constant current source is conventional, a preselected reference voltage being applied to the base of transistor 33 while its emitter is connected to a negative supply voltage through a resistor R1, the predetermined current level being then a function of the relative values of the reference voltage and the resistance R1. As is understood, the collector of transistor 33 then operates to provide a predetermined current value at a very high, effective source impedance. Depending on the application, the value of the current applied to the SCR can be determined more approximately or simply, e.g., by merely using a high value resistance to limit current instead of a transistor.

The selected value of the current applied to the cathode of SCR 31 is relatively low with respect to the digital logic signal current levels. It should thus be understood that the output signal from the digital device 15 does not operate as a control signal which controls switching of the SCR 31 so as to modulate the constant current but, rather, the digital output signal from the device 15 is, in effect, coupled through the SCR 31, the constant current provided by the transistor 31 constituting a bias current which establishes a limit on the value of current which can be coupled through the SCR 31 between the gate and anode, the SCR being operated in the remote base configuration in which the cathode functions as the remote base terminal.

FIG. 3 represents the voltage current output characteristics presented at the output terminal 11, the curve E representing the output characteristic when the signal from the digital logic circuit 15 is high (a logical 1) and the curve F representing the output characteristics when the digital output is low (a logical 0). Barring accidental connections, the output terminal 11 will conventionally be connected to the input circuit of the digital logic device of the same general family or type as gate 15, e.g., TTL logic in the example illustrated. In FIG. 2, the threshold point for establishing a logical 1 at the input of a TTL circuit is indicated at G while the threshold for assuring establishment of a logical 0 at the input circuit of a TTL device is indicated at H. As the current voltage characteristic E passes below and to the right of the point G and the voltage current characteristic F passes to the left and above the point H, it can be seen that this output circuit will suitably drive TTL loads. In other words, when the output from gate 15 is high, the output terminal 11 can source sufficient current to drive a TTL load to a voltage sufficient to assure a logical 1 . Similarly, when the output from gate 15 is low, the terminal 11 can sink sufficient current to assure a logical 0 at a TTL input circuit.

While the output signal from the digital logic gate 15 is thus sufficiently coupled to output terminal 11 to drive similar digital logic devices, it can also be seen from FIG. 3 that the SCR 31 operates to effectively limit the maximum current which can be drawn. The current is limited to a value which, while providing an adequate margin for operating reliability, is well below the maximum which can safely be drawn from such digital logic circuits without damage. As may be seen from FIG. 3, the operation of the SCR in the remote base configuration is essentially symmetrical so that the current limiting takes place for current flowing in either direction, up to the point of voltage breakdown for the SCR. As is understood, the breakdown voltage may easily be in excess of several hundred volts even in relatively inexpensive SCRs of the plastic encapsulated type.

Since, as may be seen from FIG. 2, the digital logic device itself can provide output currents greater than the limiting values indicated in FIG. 3, the excess voltage appears essentially across the SCR instead of being applied to logic device 15. Accordingly, most of the power dissipated by the overload condition is dissipated in the SCR, a device which is more suited to accommodate such dissipation than the digital logic device.

Figures 4, 5, 6:
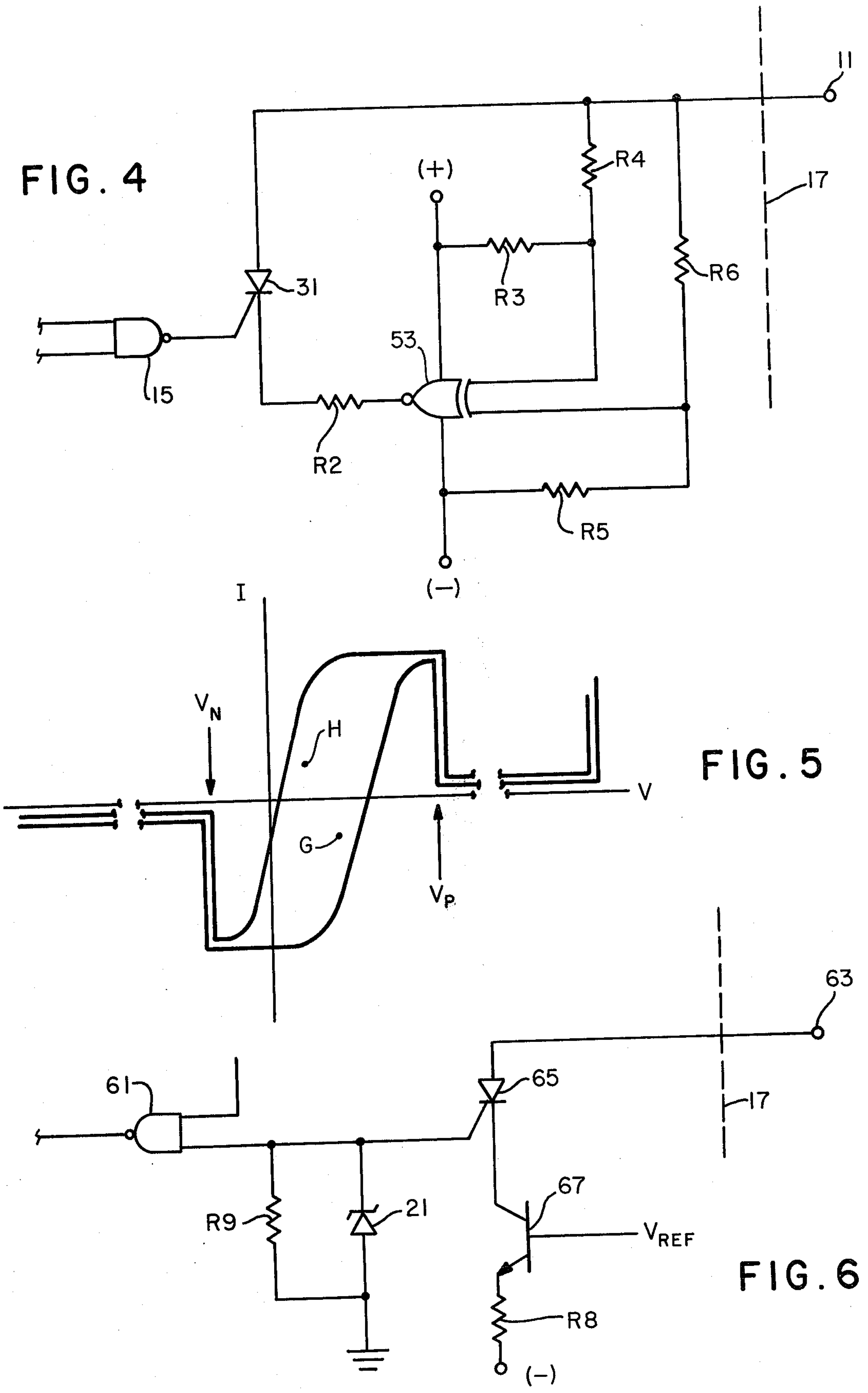
FIG. 4 is a schematic diagram of a modification of the output circuit of FIG. 1 providing further power limitation.
FIG. 5 is a graphical representation of the voltage current output characteristics of the circuit of FIG. 3.
FIG. 6 is a schematic diagram of a digital logic input circuit employing protective apparatus according to the present invention.

While in most applications, the limiting value of current can be set low enough so that the total power dissipation can be accommodated by the SCR, provision for further limiting the power dissipation to a safe area may be accomplished by the arrangement illustrated in FIG. 4. In the apparatus of FIG. 4, the substantially constant current applied to the cathode of the SCR is determined essentially by a simple resistor R2 which is driven by an exclusive NOR gate 53, for example, of the CMOS (complementary metal oxide semiconductor) type. Gate 53 is operated as a comparator to sense when the voltage at the external interface terminal 11 exceeds an essentially predetermined absolute value. One input of the exclusive NOR gate 53 is connected to a voltage divider comprising a pair of resistors R3 and R4 which are connected respectively to a positive reference voltage and to the input terminal 11, while the other input of the exclusive NOR gate 53 is connected to a voltage divider comprising a pair of resistors R5 and R6 which are connected respectively to a negative reference voltage and the external terminal 11. The positive and negative reference voltages may conveniently be the positive and negative supply voltages for the gate itself.

The current voltage output characteristic for this circuit is illustrated in FIG. 5. As long as the voltage at terminal 11 is within a deadband range of voltages on either side of ground, one of the inputs to gate 53 will be accepted as being high while the other input will be accepted as being low. Accordingly, the output will be low, thereby providing current through resistor R2 to the cathode of SCR 31 and allowing conduction of logic signals between gate and anode. If, however, the voltage at terminal 11 exceeds a predetermined positive threshold, designated $V_P$ in FIG. 5, both inputs to the exclusive NOR gate 53 will be considered to be high and the gate will switch its output to the high state, turning off the SCR 31. Accordingly, current through the SCR will drop as illustrated in FIG. 5 so that power dissipation for voltages higher than $V_P$ is substantially eliminated or significantly reduced. Likewise, if the voltage at terminal 11 goes more negative than a predetermined threshold voltage, designated $V_N$ in FIG. 5, both inputs to the exclusive NOR gate 53 will be considered to be negative. This will again cause the gate 53 to switch its output to a high state, turning off the SCR 31, thereby limiting current as illustrated in FIG. 5.

The use of an SCR connected between external and internal circuits in accordance with the present invention can also be utilized to protect the input circuits of digital logic devices. With reference to FIG. 6, reference character 61 indicates a logic device to which a logic level input signal is to be applied from an external input terminal 63. Again, the logic level signal is transmitted through an SCR, designated 65, the anode of the SCR being again directed to the external terminal while the gate lead of the SCR is connected directly to the input circuit of the digital logic device 61. Again, a preselected, substantially constant current is applied to the cathode of the SCR through an NPN transistor 67 connected as a constant current source providing a high source impedance as in FIG. 1. In order to provide a relatively low impedance to the gate circuit of SCR 65, the gate is shunted to ground through a Zener diode Z1 paralleled by a resistor R9. In effect, this shunt path acts as a low impedance bias or damping circuit to prevent the SCR from switching. The Zener diode provides a quite low impedance path for both positive and negative input logic levels while the resistor provides a relatively low impedance path at voltages between the Zener clamping levels. As will be understood by those skilled in the art, different families of digital logic devices provide different sorts of input circuit termination and protection so that the means which provides low impedance to the gate of SCR 65 may to a greater or lesser extent be provided within the logic device itself, obviating the need in some cases for a separate Zener diode and shunting resistor.

The operation of this input circuit-protecting apparatus is analogous to the similarly structured circuit of FIG. 1. The SCR operates in a remote base mode and conducts essentially symmetrically to couple logic level signals from terminal 63 to the input circuit of the digital logic gate 61. Also, the SCR again operates to limit the current which can be coupled to a level which will not damage the gate 61, excess voltages again appearing essentially across the SCR rather than being applied to the gate. As noted previously, the digital device is thereby protected against over-voltages up to the breakdown limits of the SCR device, which may easily exceed several hundred volts.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Digital logic signal output apparatus which is protected against externally applied voltages substantially outside of digital logic levels, said apparatus comprising:

an output terminal;

an SCR, the anode of said SCR being connected to said output terminal;

means for continuously applying a substantially constant bias current to the cathode of said SCR; and a digital logic circuit means for applying a digital logic signal at either of a pair of preselected logic voltage levels to the gate of said SCR, said logic level signals being transferred from the gate to the anode of said SCR with the anode operating as a non-linear current source or sink at either digital logic level, the output current value being limited for voltages substantially outside said digital logic range, the excess voltage appearing essentially across said SCR.

2. Apparatus as set forth in claim 1 wherein the cathode of said SCR is connected to the collector of an NPN transistor which is operated as a substantially constant current source.

3. Apparatus as set forth in claim 1 further comprising comparator means for determining when the voltage on said output terminal passes substantially outside digital logic levels, said current applying means being controlled by said comparator means.

4. Apparatus as set forth in claim 3 wherein said comparator means comprises an exclusive NOR gate.

5. Apparatus as set forth in claim 4 wherein said gate is a C-MOS integrated circuit.

6. Digital logic signal interfacing apparatus which protects against externally applied voltages substantially outside of digital logic levels, said apparatus comprising:

an output terminal;

an SCR, the anode of said SCR being connected to said output terminal;

a digital logic circuit means coupled for applying digital logic level signals at either of a pair of preselected logic voltage levels to the gate of said SCR, said digital logic level signals being transferred from the gate to the anode of said SCR with the anode operating as a non-linear current source or sink at either digital logic level;

sensing means responsive to voltages, at said terminal, substantially outside the normal range of digital logic levels; and source means for selectively applying a continuous substantially constant bias current at relatively high source impedance to the cathode of said SCR, said source means being controlled by said sensing means to terminate said constant current when the voltage at said terminal exceeds said normal range.

7. Apparatus as set forth in claim 6 wherein said source means is controlled by a C-MOS exclusive NOR gate.

8. Apparatus for protecting an input circuit of a digital logic circuit against externally applied voltages substantially outside the range of permissible input voltages for the device, said apparatus comprising:

an input terminal;

an SCR, the anode of said SCR being connected to said input terminal;

means connecting the gate of said SCR to the input circuit of the digital logic device, said means together with the input circuit providing a relatively low impedance load to said gate; and means for continuously applying a substantially constant bias current at relatively high source impedance to the cathode of said SCR, whereby the input current applied to said input circuit is limited to a substantially predetermined value, the excess of input voltages over said range of permissible voltages appearing across said SCR.

9. Apparatus as set forth in claim 8 wherein the cathode of said SCR is connected to the collector of an NPN transistor interconnected in a circuit as a substantially constant current source.

10. Protective interfacing apparatus for digital logic signal circuits, said apparatus comprising:

an externally accessible terminal;

a digital logic integrated circuit;

a four-layer PNPN semiconductor device having a first lead at the P-type end, a second lead at the N-type end and a third lead connected to the intermediate P-type layer adjacent the N-type end;

means connecting said first lead to said externally accessible terminal;

means connecting said third lead to said digital logic integrated circuit;

means for continuously providing through said second lead a substantially constant bias current which is substantially smaller than the digital logic level currents employed with said integrated circuit, whereby digital logic level signals are communicated between said terminal and said integrated circuit through said device but externally applied voltages substantially outside of digital logic levels appear across said device rather than being applied to said integrated circuit.

* * * * *